US008866122B1

(12) United States Patent
Lee et al.

(10) Patent No.: US 8,866,122 B1
(45) Date of Patent: Oct. 21, 2014

(54) RESISTIVE SWITCHING DEVICES HAVING A BUFFER LAYER AND METHODS OF FORMATION THEREOF

(75) Inventors: Wei Ti Lee, San Jose, CA (US);
Chakravarthy Gopalan, Santa Clara, CA (US); Yi Ma, Santa Clara, CA (US);
Kuei-Chang Tsai, Cupertino, CA (US);
Jeffrey Shields, Sunnyvale, CA (US);
Janet Wang, Los Altos, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 40 days.

(21) Appl. No.: 13/517,653

(22) Filed: Jun. 14, 2012

(51) Int. Cl.
*H01L 47/00* (2006.01)

(52) U.S. Cl.
USPC .......................... 257/4; 438/95; 257/E45.003

(58) Field of Classification Search
USPC .................. 257/4, 43, E45.003; 438/95, 104
See application file for complete search history.

(56) References Cited

U.S. PATENT DOCUMENTS

| 8,134,139 B2 | 3/2012 | Lin et al. | |
| 2010/0187493 A1* | 7/2010 | Takahashi | 257/4 |
| 2010/0252798 A1 | 10/2010 | Sumino | |
| 2011/0155988 A1 | 6/2011 | Ohba et al. | |

OTHER PUBLICATIONS

Waser, "Resistive Non-Volatile Memory Devices (Invited Papers)," ScienceDirect, Microelectronic Engineering 86, Mar. 2009, Elsevier B.V., pp. 1925-1928.

Kingon, et al., "Alternative Dielectrics to Silicon Dioxide for Memory and Logic Devices," Department of Material Science and Engineering, North Corlina State University, Nature, vol. 406, Aug. 2000, Macmillan Magazines Ltd, pp. 1032-1038.
Valov, et al. "Electochemical Metallization Memories—Fundamentals, Applications, Prospects," Topical Review, Nanotechnology 22 254003, May 2011, IOP Publishing Ltd, pp. 1-22.
Aratani, et al., "A Novel Resistance Memory with High Scalability and Nanosecond Switching," Electron Devices Meeting 2007, Washington, D.C., Dec. 2007, IEEE International, pp. 783-786.
Wong, et al., "Phase Change Memory," Proceedings of the IEEE, vol. 98, No. 12, Dec. 2010, IEEE, pp. 2201-2227.
Chen, "Status and Challenges in Ionic Memories," Strategic Technology Group, AMD, Presentation, Nov. 2008, Advanced Micro Devices, Inc, 34 pages.
Wong, "Emerging Memories," Department of Electrical Engineering, Stanford University, Presentation, Apr. 2008, 77 pages.

* cited by examiner

*Primary Examiner* — Quoc Hoang
(74) *Attorney, Agent, or Firm* — Slater & Matsil, L.L.P.

(57) ABSTRACT

In one embodiment, a resistive switching device includes a bottom electrode, a switching layer, a buffer layer, and a top electrode. The switching layer is disposed over the bottom electrode. The buffer layer is disposed over the switching layer and provides a buffer of ions of a memory metal. The buffer layer includes an alloy of the memory metal with an alloying element, which includes antimony, tin, bismuth, aluminum, germanium, silicon, or arsenic. The top electrode is disposed over the buffer layer and provides a source of the memory metal.

36 Claims, 16 Drawing Sheets

US 8,866,122 B1

RESISTIVE SWITCHING DEVICES HAVING A BUFFER LAYER AND METHODS OF FORMATION THEREOF

TECHNICAL FIELD

The present invention relates generally to resistive switching devices, and more particularly, resistive switching devices having buffer layers and methods of formation thereof.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), metal oxide based memories, and ionic memories such as conductive bridging random access memory (CBRAM) or programmable metallization cell (PMC) memory. These memories are also called as emerging memories.

To be viable, the emerging memory has to be better than Flash memory in more than one of technology metrics such as scalability, performance, energy efficiency, On/Off ratio, operational temperature, CMOS compatibility, and reliability.

SUMMARY OF THE INVENTION

These and other problems are generally solved or circumvented, and technical advantages are generally achieved, by illustrative embodiments of the present invention.

In one embodiment, a resistive switching device includes a bottom electrode, a switching layer, a buffer layer, and a top electrode. The switching layer is disposed over the bottom electrode. The buffer layer is disposed over the switching layer and provides a buffer of ions of a memory metal. The buffer layer includes an alloy of the memory metal with an alloying element, which includes antimony, tin, bismuth, aluminum, germanium, silicon, or arsenic. The top electrode is disposed over the buffer layer and provides a source of the memory metal.

In another embodiment of the present invention, a resistive switching device comprises a bottom electrode, a switching layer disposed over the bottom electrode, and a buffer layer disposed over the switching layer. The buffer layer provides a buffer of ions of a memory metal, the buffer layer comprising a reactive element. A cap layer is disposed over the buffer layer. The cap layer forms a barrier to the reactive element in the buffer layer. A top electrode is disposed over the buffer layer. The top electrode provides a source of the memory metal.

In another embodiment of the present invention, a resistive switching device comprises a bottom electrode, a switching layer disposed over the bottom electrode, and a buffer layer disposed over the switching layer. The buffer layer provides a buffer of ions of a memory metal. A top electrode is disposed over the buffer layer. The top electrode provides a source of the memory metal. The top electrode comprises an alloying element comprising antimony, tin, bismuth, aluminum, arsenic, germanium, and silicon.

In yet another embodiment of the present invention, a resistive switching device comprises a bottom electrode, a switching layer disposed over the bottom electrode, and a buffer layer disposed over the switching layer. The buffer layer comprises an alloying element and provides a buffer of ions of a memory metal. The alloying element has a graded profile within the buffer layer. A top electrode is disposed over the buffer layer. The top electrode provides a source of the memory metal.

In accordance with an embodiment of the present invention, method of forming a resistive switching device includes forming a bottom electrode in a first insulating layer, and forming a second insulating layer over the first insulating layer. A switching layer is formed over the bottom electrode in the second insulating layer. A buffer layer is formed over the switching layer in the second insulating layer. The buffer layer provides a buffer of ions of a memory metal. The buffer layer comprises an alloy of the memory metal with an alloying element comprising antimony, tin, bismuth, aluminum, germanium, silicon, or arsenic. A top electrode is formed over the buffer layer in a third insulating layer. The top electrode provides a source of the memory metal.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 3, which includes FIGS. 3A and 3B, illustrates a resistive switching device in accordance with an alternative embodiment of the invention, wherein FIG. 3A illustrates a cross-sectional view and wherein FIG. 3B illustrates a 1-D profile of the alloying element in the top electrode layer;

FIG. 4, which includes FIGS. 4A and 4B, illustrates a resistive switching device having a graded buffer layer in accordance with an embodiment of the invention, wherein FIG. 4A illustrates a cross-sectional view and FIG. 4B illustrates a 1-D profile of the buffer layer;

FIG. 7, which includes FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the invention enable faster operation of resistive switching memories by using buffer layers. Further, advantageously, embodiments of the invention overcome yield issues that may be associated with the use of such buffer layers.

A structural embodiment of the present invention for a resistive switching device will be described using FIG. 1. Further structural embodiments of the resistive switching device will be described using FIGS. 2-6. Embodiments of methods of fabricating the resistive switching device will be described using FIGS. 7 and 8.

Figure 1:
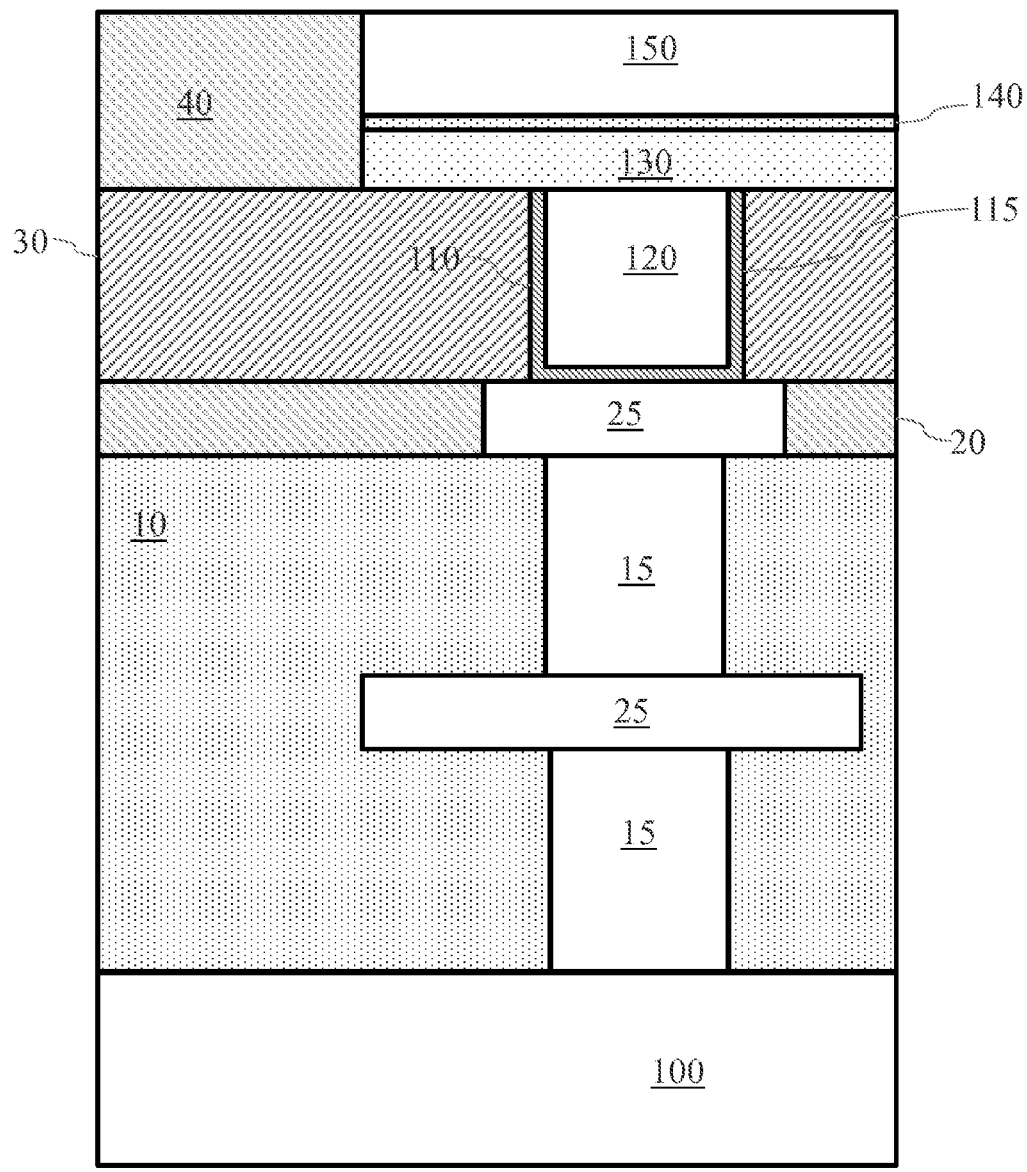
FIG. 1 illustrates a resistive switching device integrated over a semiconductor substrate in accordance with an embodiment of the invention.

FIG. 1 illustrates a resistive switching device integrated over a semiconductor substrate in accordance with an embodiment of the invention.

Referring to FIG. 1, a resistive switching device is disposed over a substrate 100. The resistive switching device is disposed within the metallization levels formed over the substrate 100. In various integration schemes, the location of the resistive switching device within the metallization layers may be different. As an example, in one embodiment, the resistive switching device may be formed over the first and the second metal level.

As illustrated in FIG. 1, at least one of a plurality of metal lines 25 and at least one of a plurality of vias 15 are disposed within a first insulating layer 10 over a substrate 100 in one more embodiments. The substrate 100 may comprise a bulk silicon substrate or a silicon-on-insulator substrate. In various embodiments, the substrate 100 may comprise SiGe, GaN, or other semiconductor materials. In one or more embodiments, the substrate 100 may comprise any other suitable semiconductor, for example, within which an access device such as a transistor or a diode may be fabricated.

In various embodiments, the resistive switching device comprises a bottom electrode 115, a switching layer 130, a buffer layer 140, a top electrode layer 150. The bottom electrode 115 may be coupled to a metal line of the plurality of metal lines 25 disposed within a second insulating layer 20. The second insulating layer 20 may be the same material as the first insulating layer 10 or may be a different dielectric material.

The bottom electrode 115 may be an inert electrode and may be enclosed within a diffusion barrier/adhesion promoting layer. Accordingly, the bottom electrode 115 may comprise a barrier layer 110 and a fill material 120 disposed within the barrier layer 110. Together, the barrier layer 110 and the fill material 120 form the bottom electrode 115. In one embodiment, tungsten (W) may be used as the fill material 120. Thus, tungsten plugs may be used as the bottom electrode 115. In other embodiments, the bottom electrode 115 may comprise platinum, ruthenium, tantalum, titanium nitride, tantalum nitride, titanium tungsten (TiW), molybdenum, gold, nickel, cobalt, iridium, and combinations thereof, and such others.

The barrier layer 110 is designed to prevent in-diffusion of metal atoms from the underlying metal line of the plurality of metal lines 25. Further, the barrier layer 110 may be configured to promote adhesion with the third insulating layer 30. In one embodiment, the barrier layer 110 may comprise tantalum nitride to prevent copper diffusion from the underlying metal line of the plurality of metal lines 25. In an alternative embodiment, the barrier layer 110 may comprise titanium nitride. In other embodiments, the barrier layer 110 may comprise ruthenium, tungsten nitride, and other suitable materials used as barrier in the semiconductor industry.

The bottom electrode 115 may be embedded within a third insulating layer 30 in one embodiment.

In one or more embodiments, the switching layer 130 may comprise a solid electrolyte layer that provides an ion conducting path capable of forming a conductive bridge. In various embodiments, the solid electrolyte (switching layer 130) may comprise a chalcogenide material such as a germanium based chalcogenide, e.g., a copper doped $GeS_2$ layer. In an alternative embodiment, the solid electrolyte may comprise silver doped $GeS_2$. In other embodiments, the solid electrolyte may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, the solid electrolyte may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof.

In one embodiment, the switching layer 130 may comprise transition metal oxides that change conductivity due to the formation of charged point defects such as oxygen vacancies and other charge complexes so as to form a metallic conducting phase. The switching layer 130 may comprise metal oxides such as copper and/or silver doped hafnium oxide, gadolinium oxide, and over such materials in various embodiments. In other examples, a metal oxide based switching layer 130 may comprise $NiO_x$, $TiO_x$, $Al_2O_3$, $Ta_2O_5$, $CuO_x$, $WO_x$, CoO, chromium doped perovskite oxides such as $SrZrO_3$, (Ba, Sr)$TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$.

The resistive switching device further comprises a buffer layer 140 disposed over and contacting the switching layer 130. A top electrode layer 150 is disposed over and contacts the buffer layer 140. The buffer layer 140 is a buffer for the conductive ions of the resistive switching device. As an illustration, atomic metal in the top electrode layer 150 has to be converted to metal ions. However, the metal is already present in an ionic form in the buffer layer 140 and therefore expedites the programming operation.

In one or more embodiments, the buffer layer 140 provides a layer that allows more efficient oxidation of the metal in the top electrode layer 150, which is the source of the metal ions. The buffer layer 140 provides a first ionic conductive medium to quickly transport the generated metal ions to the switching layer 130. Further, the buffer layer 140 facilitates injection of the generated metal ions when an electric field is applied and further facilitates dissolution of the metal ions from the switching layer 130 when the electric field is reversed.

In one or more embodiments, the buffer layer 140 is a memory metal alloy, which is an alloy of the memory metal and an alloying element. The memory metal is the diffusing metal that results in the formation of the conduction path within the switching layer 130. In one or more embodiments, the alloying element comprises germanium, antimony, or tin. In various embodiments, the buffer layer 140 comprises a metalloid such as antimony, arsenic, tin, bismuth, aluminum, germanium, silicon, and combinations thereof.

In one or more embodiments, the alloying element is chosen so as to keep the memory metal in ionic form. Further, in various embodiments, the alloying element forms a stable phase with the memory metal such that the memory metal alloy is thermally and electrically stable over the operating conditions. In various embodiments, the effective diffusivity of the memory metal (ionic or otherwise) in the memory metal alloy is greater than the effective diffusivity of the memory metal ion in the switching layer 130. This ensures that the buffer layer 140 does not inhibit the transport of the memory metal ions.

In various embodiments, extremely reactive metals such as tellurium and sulfur are not used to form the memory metal alloy. This is because such metals impede the subsequent formation of the top electrode layer 150. For example, a buffer layer 140 comprising tellurium and/or sulfur may have a high reactivity which may result in the formation of defects during the subsequent deposition of the top electrode layer 150. Thus, embodiments of the invention avoid the negative effects associated with the use of a buffer layer comprising tellurium and/or sulfur.

In various embodiments, more than one alloying element may be used to form the memory metal alloy. In various embodiments, the total concentration of the alloying elements in the buffer layer 140 may vary from about 10% to about 90% by atomic weight. In one embodiment, the total concentration of the alloying elements in the buffer layer 140 may vary from about 10% to about 50% by atomic weight. In one embodiment, the total concentration of the alloying elements in the buffer layer 140 may vary from about 50% to about 80% by atomic weight. In one embodiment, the total concentration of the alloying elements in the buffer layer 140 is at least about 5%. In one embodiment, the total concentration of the alloying elements in the buffer layer 140 is at least about 50%. In one embodiment, the total concentration of the alloying elements in the buffer layer 140 is less than about 90%.

In various embodiments, the buffer layer 140 has a thickness of at least about 5 nm. In various embodiments, the buffer layer 140 has a thickness of at least about 20 nm. In various embodiments, the buffer layer 140 has a thickness of about 1 nm to about 50 nm. In one or more embodiments, the buffer layer 140 has a thickness of about 5 nm to about 100 nm. In one embodiment, the buffer layer 140 has a thickness of about 5 nm to about 20 nm. In one embodiment, the buffer layer 140 has a thickness of about 20 nm.

The top electrode layer 150 may comprise an electrochemically active metal such as silver, copper, zinc, and others in various embodiments. The top electrode layer 150 may also have a cap layer such as titanium nitride or tantalum nitride (as well as other suitable materials) in various embodiments.

The switching layer 130, the buffer layer 140, and the top electrode layer 150 may be formed within a fourth insulating layer 40, which may be a suitable inter level dielectric. Examples of the fourth insulating layer 40 may include silicon dioxide, silicon nitride, silicon oxynitride, and other low-k dielectrics. The fourth insulating layer 40 may be a plurality of layers such as a bilayer in some embodiments.

Figure 2:
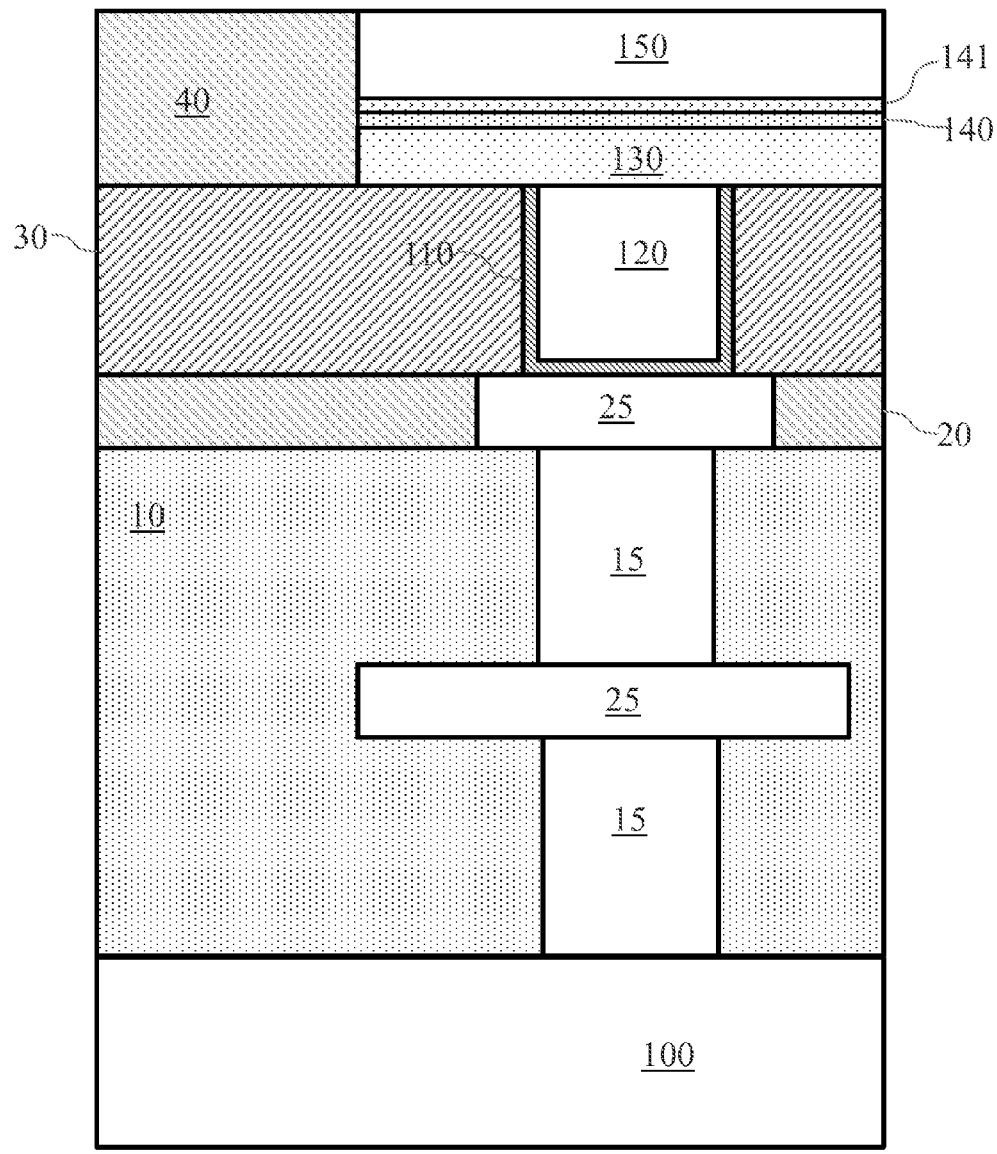
FIG. 2 illustrates a cross-sectional view of the resistive switching device having a buffer layer and an additional cap layer in accordance with an embodiment of the invention.

FIG. 2 illustrates a cross-sectional view of the resistive switching device having a buffer layer and an additional cap layer in accordance with an embodiment of the invention.

Unlike the prior embodiment described with respect to FIG. 1, in this embodiment, a capping layer 141 is formed over the buffer layer 140. Advantageously, this provides greater flexibility in the choice of material selection for the buffer layer 140 and the capping layer 141. In this embodiment, the capping layer 141 comprises a material that does not impede the transport of metal ions. Further, the capping layer 141 provides a surface that does not generate defects during the subsequent deposition of the top electrode layer 150. In various embodiments, the capping layer 141 may comprise antimony, tin, arsenic, bismuth, aluminum, germanium, silicon as well as other less reactive metals. In contrast, the buffer layer 140 may comprise any suitable buffer including memory metal alloys formed using tellurium and/or sulfur. Unlike the prior embodiment, the reactive tellurium and sulfur-based memory metal alloys do not directly interact with the deposition process of the top electrode layer 150 because of the intermediary capping layer 141.

In various embodiments, the capping layer 141 may comprise alloys that may not have any memory metal content. In various embodiments, the capping layer 141 may comprise alloys that provide a barrier to the more reactive elements such as tellurium and/or sulfur.

In or more embodiments, the capping layer 141 may comprise a pure metal layer of antimony, tin, arsenic, bismuth, germanium, silicon, and/or aluminum. In one or more embodiments, the capping layer 141 may also comprise an alloy comprising antimony, tin, arsenic, bismuth, germanium, silicon, and/or aluminum. This is because the capping layer 141 is a very thin layer and does not participate in the operation of the resistive switching device. Therefore, in various embodiments, the capping layer 141 is a material having a combination of higher effective diffusivity for the memory metal and lower thickness relative to the buffer layer 140.

Accordingly, in various embodiments, the capping layer 141 may comprise a thickness of about 0.5 nm to about 5 nm. In one embodiment, the capping layer 141 may comprise a thickness of about 0.5 nm to about 1 nm. In one embodiment, the capping layer 141 may comprise a thickness of about 1 nm to about 10 nm.

Thus in this embodiment, at least two layers may be formed between the bottom electrode 115 and the top electrode layer 150. In one embodiment, a first layer, i.e., a buffer layer 140 comprising tellurium and/or sulfur is followed by a second layer, i.e. the capping layer 141 having no tellurium and/or sulfur.

Figure 3A:
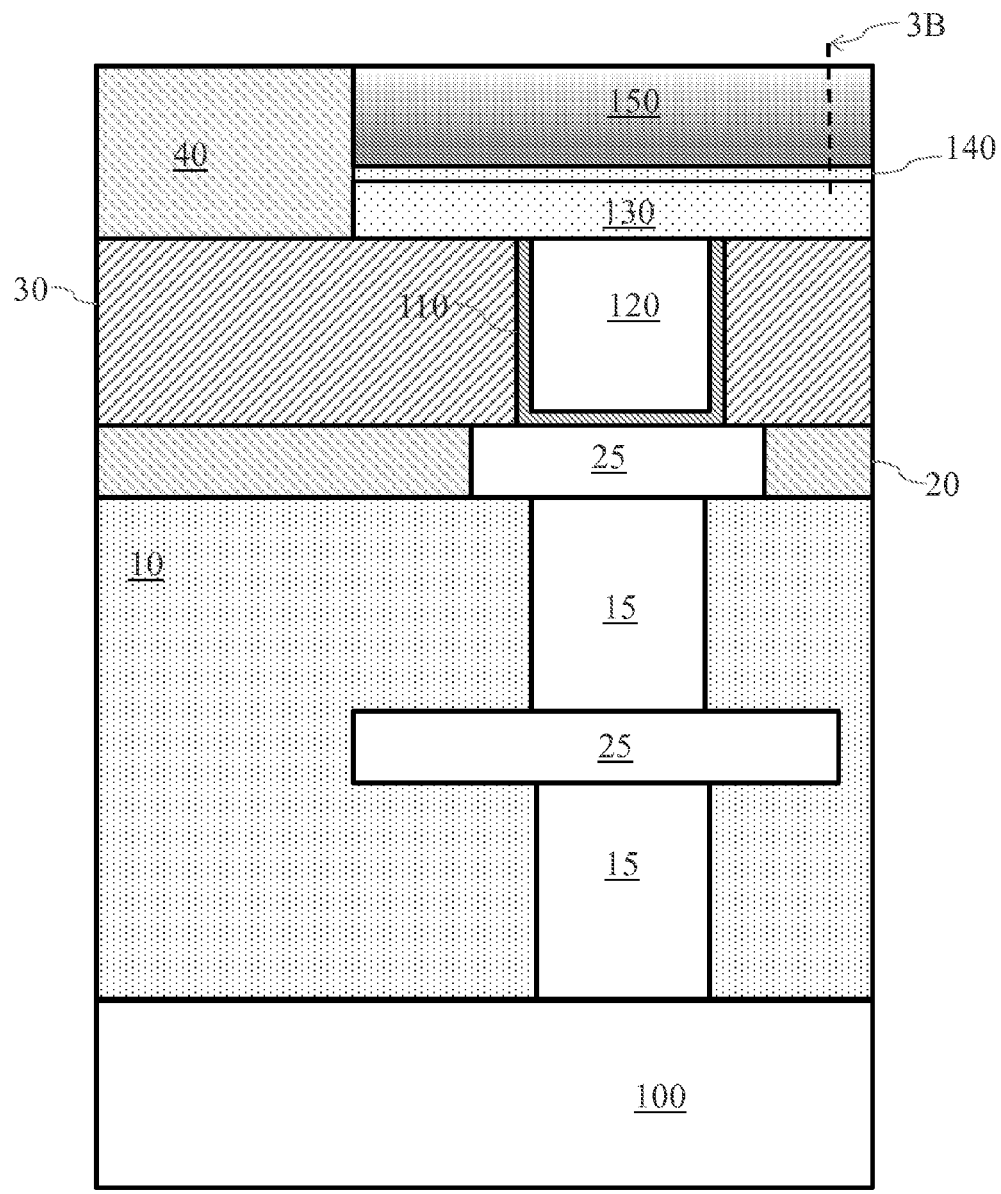
Figure 3B:
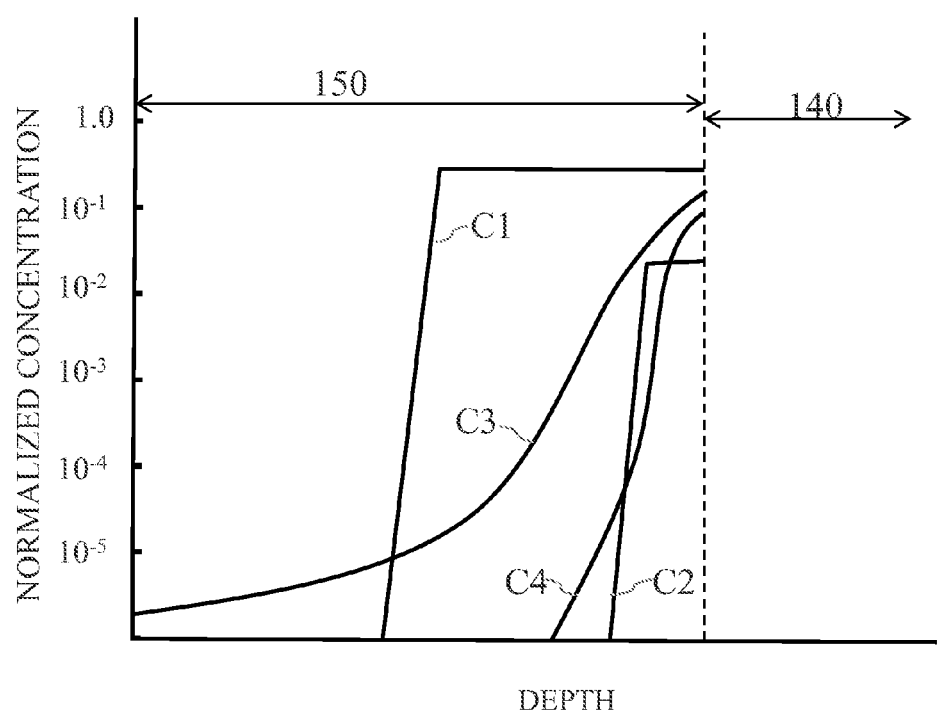

FIG. 3, which includes FIGS. 3A and 3B, illustrates a resistive switching device in accordance with an alternative embodiment of the invention, wherein FIG. 3A illustrates a cross-sectional view and wherein FIG. 3B illustrates a 1-D profile of the alloying element in the top electrode layer.

Similar to the embodiment described with respect to FIG. 2, in this embodiment, the buffer layer 140 may comprise reactive elements such as tellurium and/or sulfur. However, in this embodiment, the top electrode layer 150 is doped such that any defectivity associated with the deposition of the top electrode layer 150 is avoided. In various embodiments, the top electrode layer 150 may be doped or alloyed with one or more of a metalloid such as antimony, tin, arsenic, bismuth, germanium, silicon, and/or aluminum. Further, the doping of the top electrode layer 150 may be varied during the deposition process in various embodiments.

As illustrated in the 1-D profile of FIG. 3B, the concentration of the alloying element may be highest at the interface between the top electrode layer 150 and the buffer layer 140. This peak concentration may vary from about 10% to about 90% by atomic weight in various embodiments.

In one embodiment, the concentration of the alloying element may vary as illustrated by the first curve C1, which has a step profile extending for about half the thickness of the top electrode layer. In another embodiment, the concentration of the alloying element may vary as illustrated by the second curve C2, which also has a step profile but extends to a smaller thickness than the first curve. In contrast, in other embodiments, the concentration of the alloying element may vary continuously, for example, as illustrated by the third curve C3 and the fourth curve C4.

As illustrated in various embodiments, the concentration of the alloying element may change within the graded profile by at least 100 times to 1000 times within 10% to about 50% of the thickness of the top electrode layer 150, e.g., about 1 nm to about 10 nm from an interface of the top electrode layer 150 within the buffer layer 140.

Figure 4A:
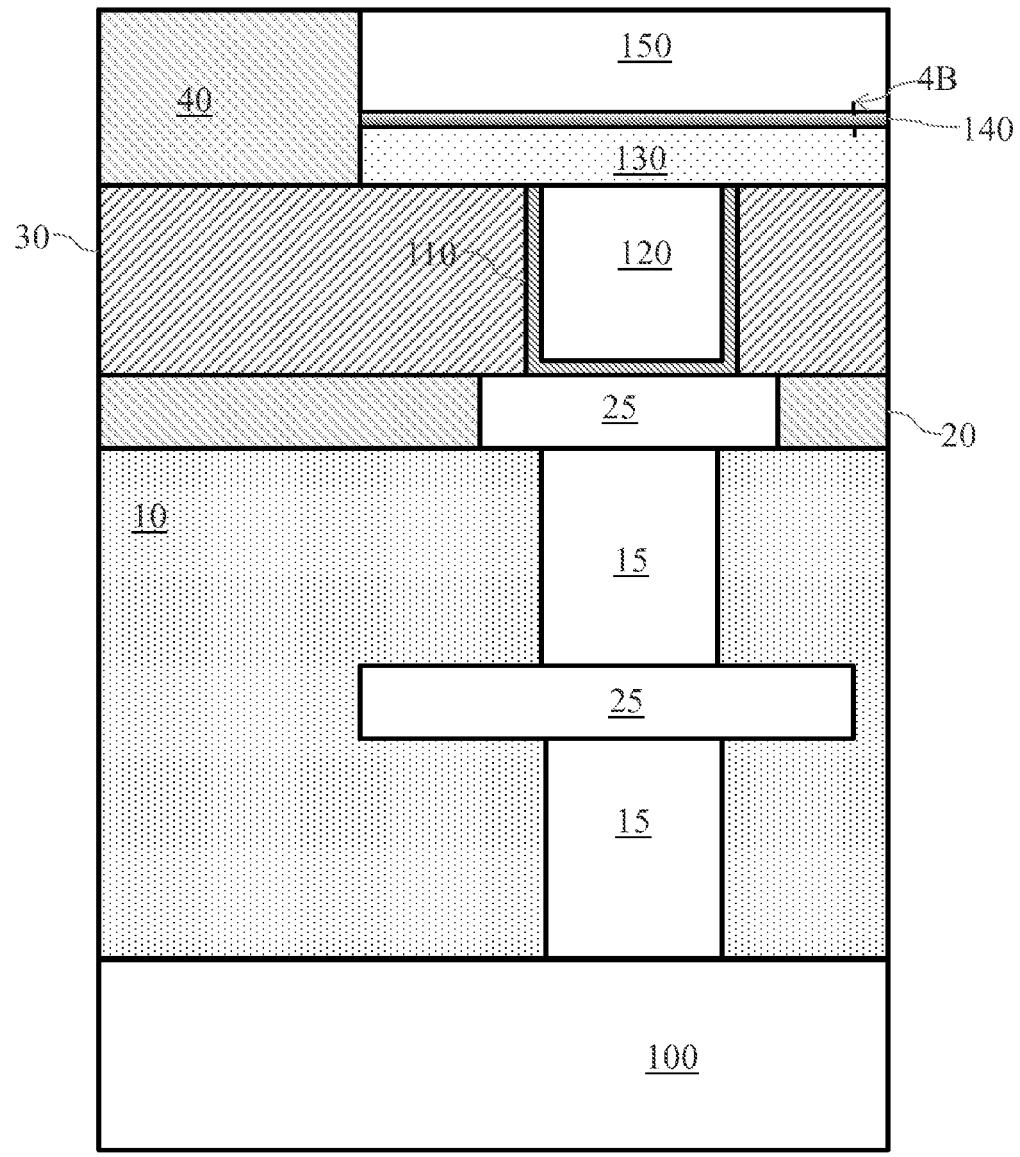
Figure 4B:
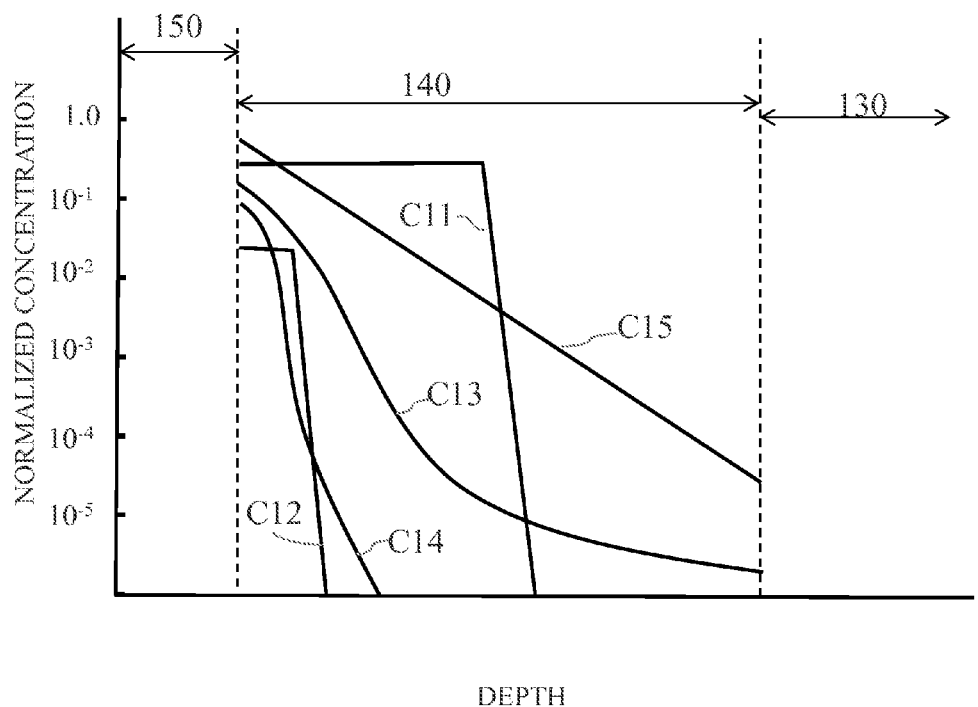

FIG. 4, which includes FIGS. 4A and 4B, illustrates a resistive switching device having a graded buffer layer in accordance with an embodiment of the invention, wherein FIG. 4A illustrates a cross-sectional view and FIG. 4B illustrates a 1-D profile of the buffer layer.

In this embodiment, the relative concentration of the alloying elements may be changed within the buffer layer 140. FIG. 4B illustrates the normalized concentration (relative ratio of less reactive metalloids such as antimony, germanium, silicon, tin to reactive metalloids such as tellurium, sulfur) within the buffer layer 140.

As illustrated in FIG. 4B, the amount of the reactive alloying element is lower towards the interface with the top electrode layer 150. This change may follow a step function as illustrated in the first profile C11 and the second profile C12. Alternatively, the variation in the alloying element ratio may follow a smoother profile as illustrated in the third profile C13 or the fourth profile C14. Further, the change in the ratio of the reactive alloying element to the less reactive alloying element may follow a linear profile such as the fifth profile C15.

Figure 5:
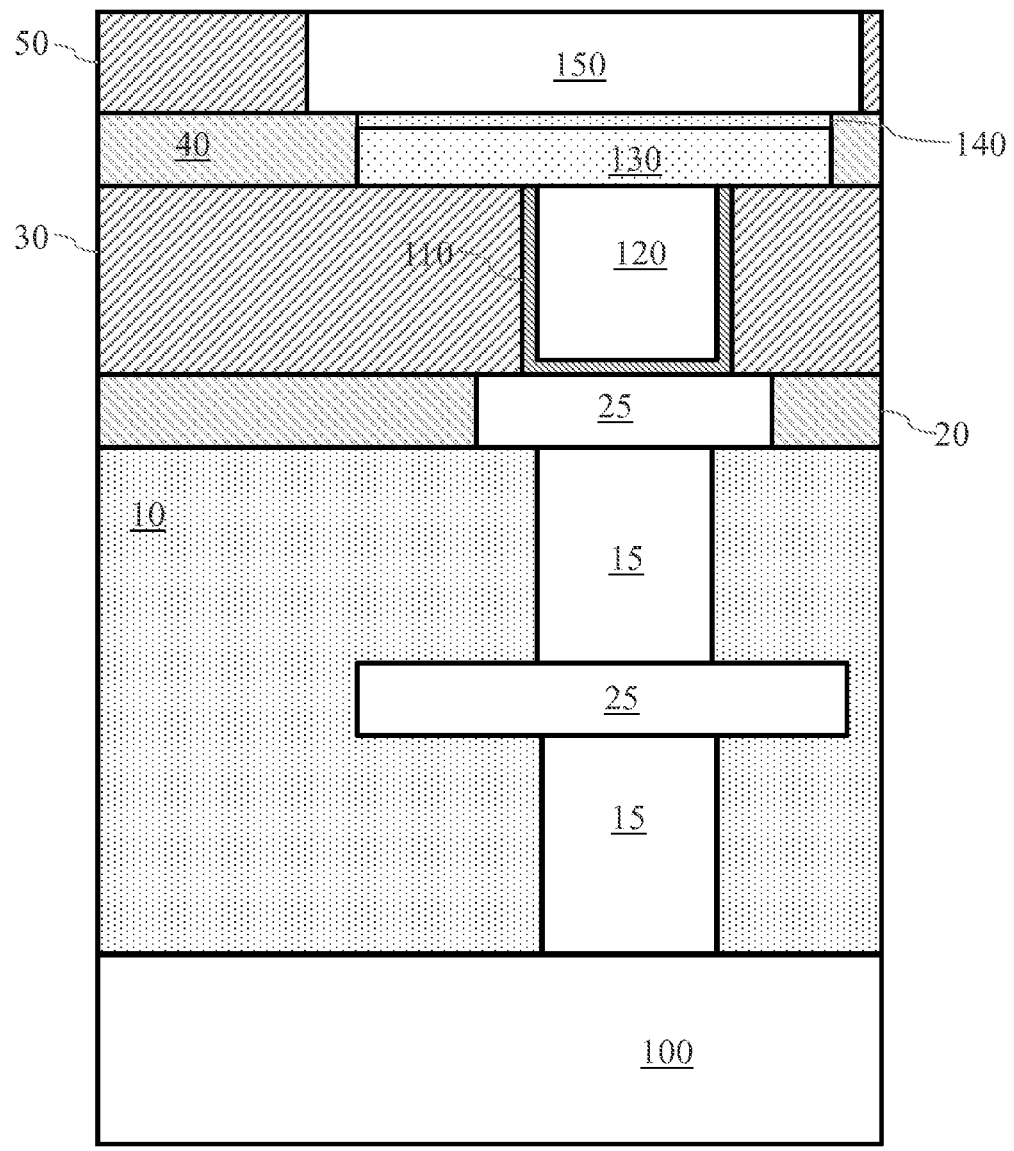
FIG. 5 illustrates a cross-sectional view of a resistive switching device having a buffer layer in accordance with an embodiment of the invention.

FIG. 5 illustrates a cross-sectional view of a resistive switching device having a buffer layer in accordance with an embodiment of the invention.

The resistive devices described above in FIGS. 1-4 may be formed with different structural ratios. As an example, FIG. 5 shows one possible structure in which the foot print (or at least one critical dimension) of the switching layer 130 and the buffer layer 140 is less than the foot print of the top electrode layer 150. Accordingly, the switching layer 130 and the buffer layer 140 may be disposed in a fourth insulating layer 40, while the top electrode layer 150 may be disposed in a separate fifth insulating layer 50.

Figure 6:
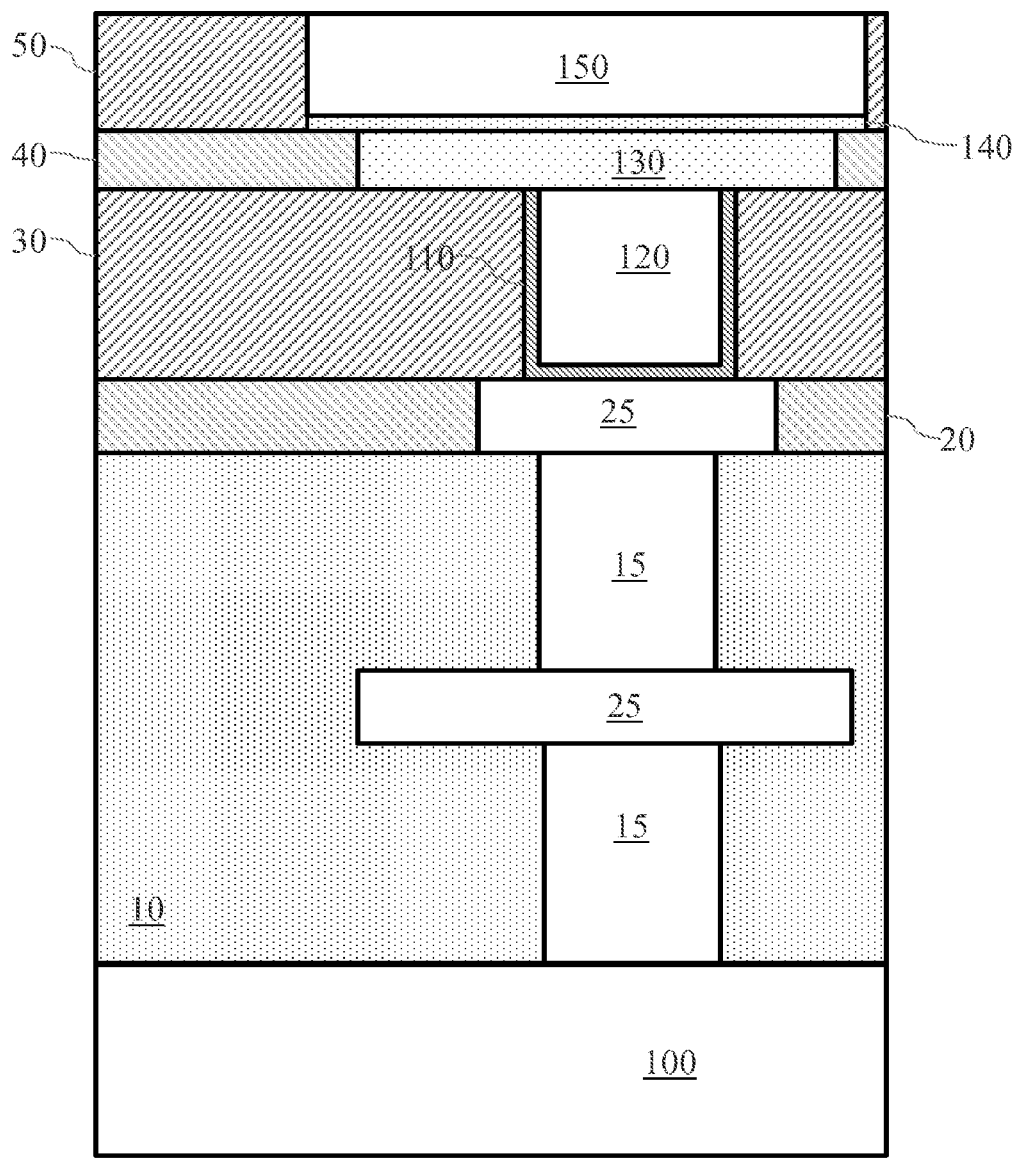
FIG. 6 illustrates a cross-sectional view of a resistive switching device having a buffer layer in accordance with an alternate embodiment of the invention.

FIG. 6 illustrates a cross-sectional view of a resistive switching device having a buffer layer in accordance with an alternate embodiment of the invention.

FIG. 6 illustrates another alternative embodiment in which the foot print of the switching layer 130 is less than the foot print of the buffer layer 140 and the top electrode layer 150. In this embodiment, the switching layer 130 is disposed in a fourth insulating layer 40 while the buffer layer 140 and the top electrode layer 150 are disposed in a separate fifth insulating layer 50.

FIG. 7, which includes FIGS. 7A-7F, illustrates cross-sectional views of a resistive switching device during various stages of fabrication in accordance with embodiments of the invention.

Figure 7A:
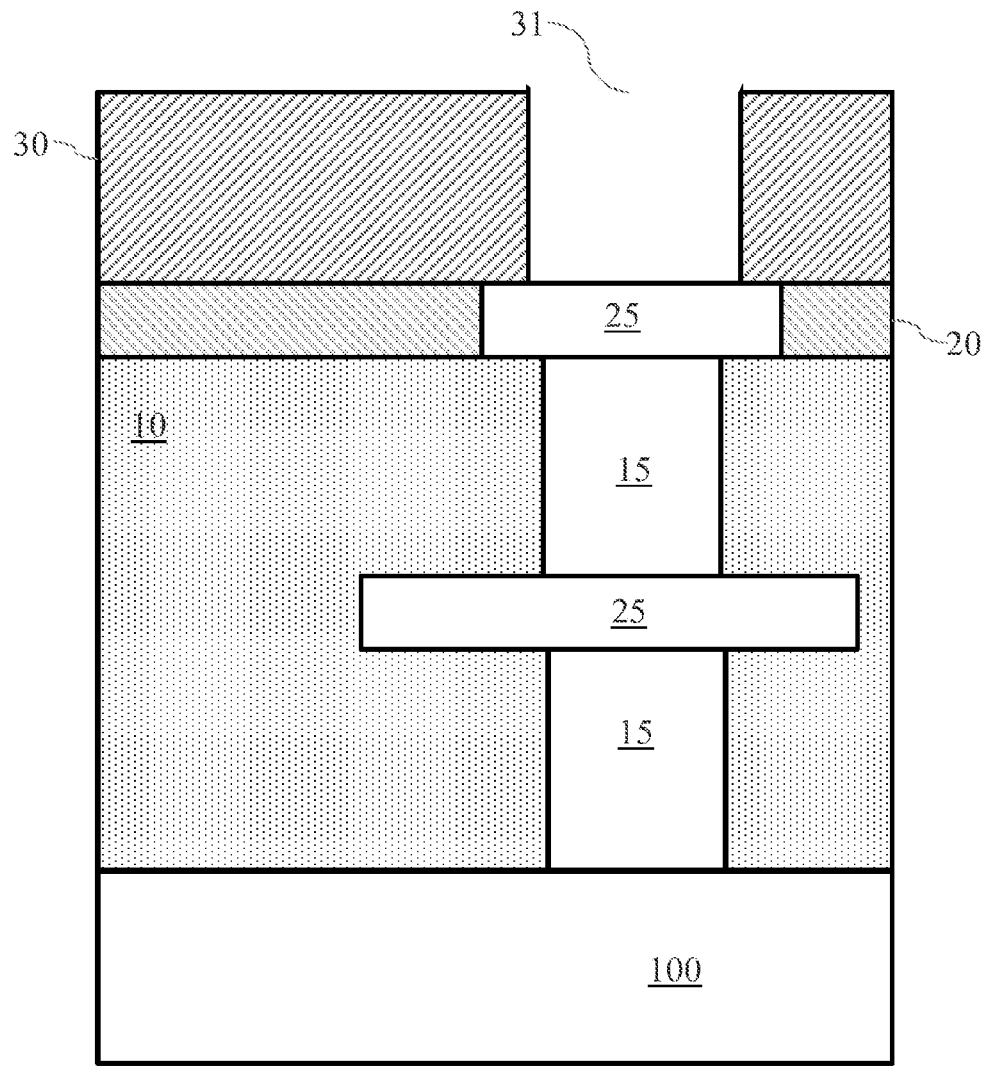
FIGS. 7A-7F, illustrates cross-sectional views of a resistive switching device during various stages of fabrication in accordance with embodiments of the invention.

Referring to FIG. 7A, the substrate 100 is processed using conventional processing. For example, active regions may be formed within the substrate 100. The active regions may comprise device regions such as transistors, diodes, and other devices. After forming the active regions, metallization layers are formed above the substrate 100. For example, a plurality of vias 15 and a plurality of metal lines 25 may be formed as illustrated in FIG. 7A.

In various embodiments, a bottom electrode will be formed within the third dielectric layer 30, which may comprise silicon nitride, silicon oxide, and others and may be about 10 nm to about 1000 nm, and about 30 nm to about 50 nm in one case. In one or more embodiments, the third dielectric layer 30 may be deposited using a chemical vapor deposition process or a plasma enhanced chemical vapor deposition process. The third dielectric layer 30 may be deposited using a physical vapor deposition (PVD), although in different embodiments, other deposition techniques may be used. As illustrated in FIG. 7A, an opening 31 is formed within the third insulating layer, which is formed over the substrate 100.

Figure 7B:
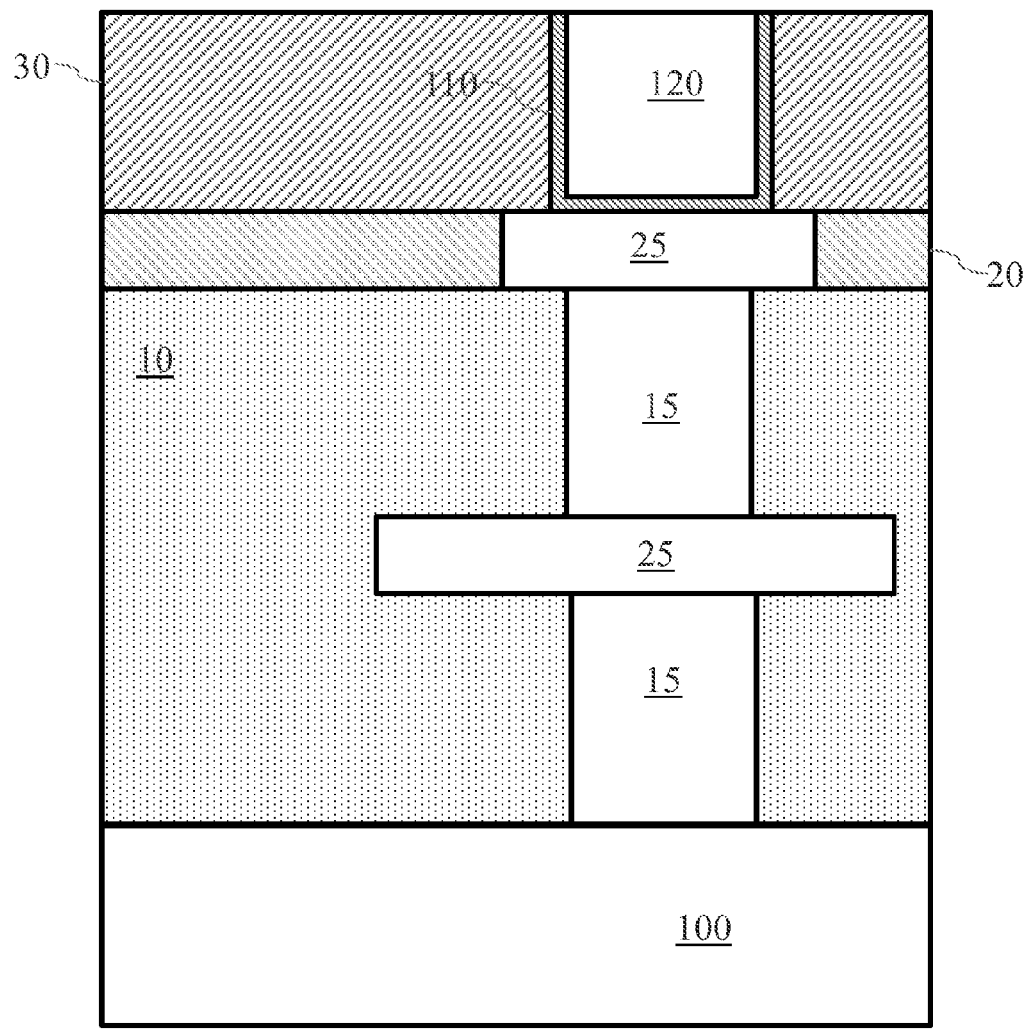

Referring to FIG. 7B, a barrier layer 110 is deposited within the opening 31. In various embodiments, the barrier layer 110 may be deposited using sputtering, a vapor deposition process such as physical vapor deposition, chemical vapor deposition, and other suitable processes. The barrier layer 110 may comprise an inert material that is also a diffusion blocking material such as titanium nitride, tantalum nitride and others.

Next, a fill material 120 is deposited within the opening 31. The fill material 120 may be deposited using multiple processes in various embodiments. For example, a thin layer of the fill material 120 may be deposited first using a physical vapor deposition (PVD) process to ensure good adhesion with the barrier layer 110. Next, a chemical vapor deposition process may be used to fill the opening 31 with the fill material 120. The fill material 120 may comprise an inert material such as tungsten in one embodiment. The fill material 120 may be planarized as needed and any remaining barrier layer 110 over the top surface of the third insulating layer is removed, for example, using a wet etching.

Figure 7C:
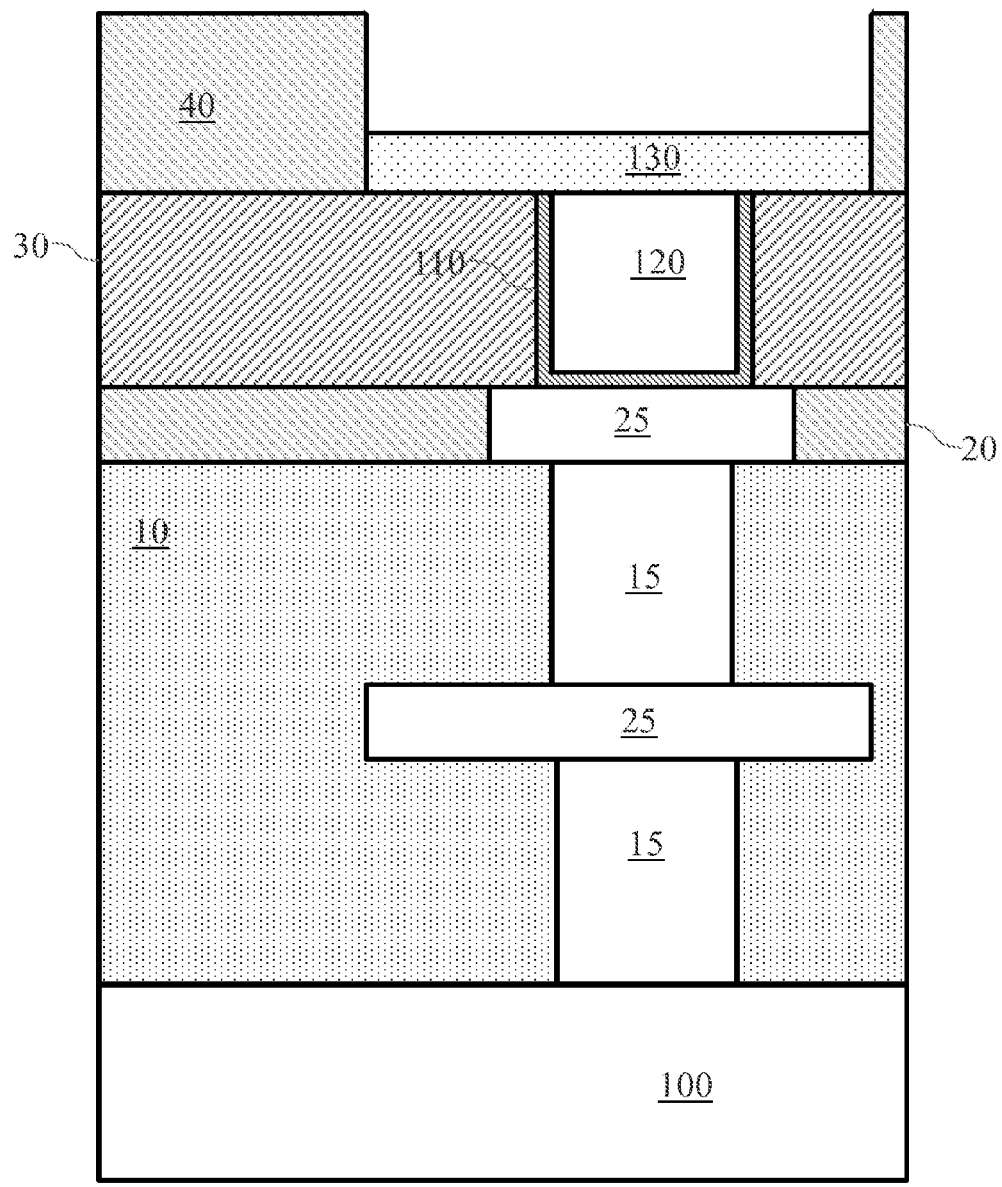

Referring to FIG. 7C, a fourth insulating layer 40 is deposited over the third insulating layer 30. The fourth insulating layer 40 is patterned to form an opening for the switching layer 130, which may be deposited within the opening. In various embodiments, the switching layer 130 may comprise a thin film of $GeS_2$ deposited by radio frequency (RF) PVD process and a thin layer of copper or silver deposited by DC PVD process. This silver layer is subsequently dissolved into the $GeS_2$ film using a photo-diffusion process form a copper or silver doped $GeS_2$ layer. In other embodiments, the switching layer 130 may be formed, e.g., using a deposition process to form $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, $SiO_2$. In some embodiments, a plurality of layers may be deposited, for example, using an atomic layer deposition process to form a stack comprising $Ge_xSe_y/SiO_x$, $Ge_xSe_y/Ta_2O_5$, $Cu_xS/Cu_xO$, $Cu_xS/SiO_2$. In further embodiments, one or more layers of $NiO_x$, $TiO_x$, $Al_2O_3$, $Ta_2O_5$, $CuO_x$, $WO_x$, CoO, $Gd_2O_3$, $HfO_2$, chromium doped perovskite oxides such as $SrZrO_3$, $(Ba, Sr)TiO_3$, $SrTiO_3$, copper doped $MoO_x$, copper doped $Al_2O_3$, copper doped $ZrO_2$, Al doped ZnO, $Pr_{0.7}Ca_{0.3}MnO_3$ may be deposited.

Figure 7D:
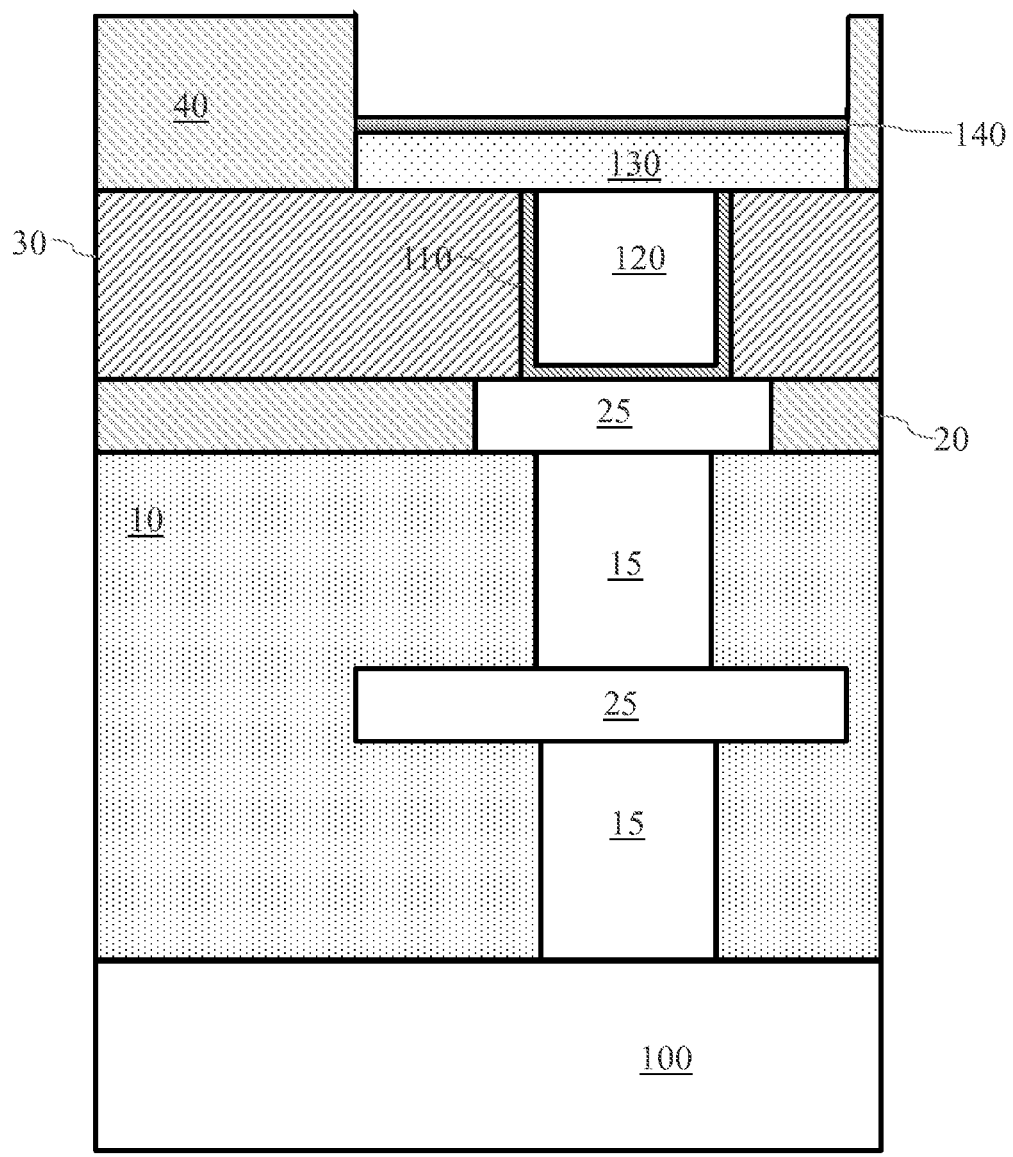

Referring to FIG. 7D, a buffer layer 140 is formed over the switching layer 130. In various embodiments, the buffer layer 140 may be formed using any of the embodiments described in FIGS. 1-4.

In one embodiment, the buffer layer 140 has a graded doping profile as described with respect to FIG. 4. The graded doping profile may be obtained using a common deposition process in which the ratio of the source gas is changed during the deposition. For example, the flow rate of a precursor for the deposition of tellurium and/or sulfur is reduced during the deposition process in one embodiment. Alternatively, the flow rate of a precursor for the deposition of a less reactive metalloids such as antimony, tin, arsenic, bismuth, germanium, silicon, and/or aluminum is increased during the deposition process. In further embodiments, both of the above changes may be performed simultaneously. In some embodiments, a constant profile of tellurium and/or sulfur may be deposited within the buffer layer 140.

In various embodiments, the buffer layer 140 may be deposited using a sputtering process, a vapor deposition process such as a physical vapor deposition process, a chemical vapor deposition process, an atomic layer deposition process, and other processes.

Figure 7E:
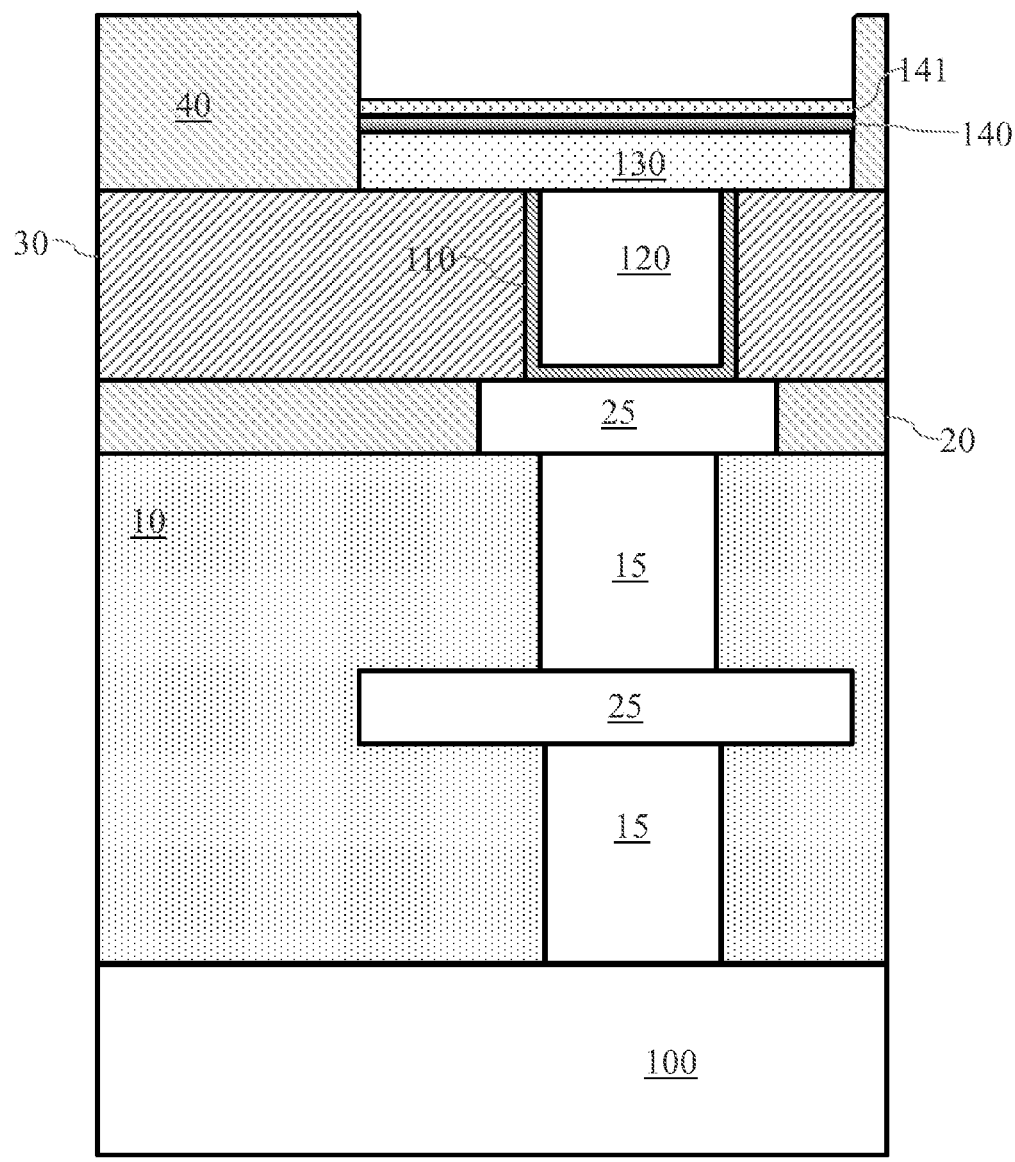

FIG. 7E illustrates the resistive switching device after the formation of a capping layer 141 in accordance with an embodiment of the invention. The capping layer 141 may be optional and may be skipped in some embodiments. The capping layer 141 may not comprise a reactive metalloid such as tellurium or sulfur in one or more embodiments.

Further, in some embodiments, the capping layer 141 (after deposition) may not comprise the memory metal, i.e. the diffusing conducting ion. However, the capping layer 141 may include some of the memory metal atoms during operation of the resistive switching device.

Figure 7F:
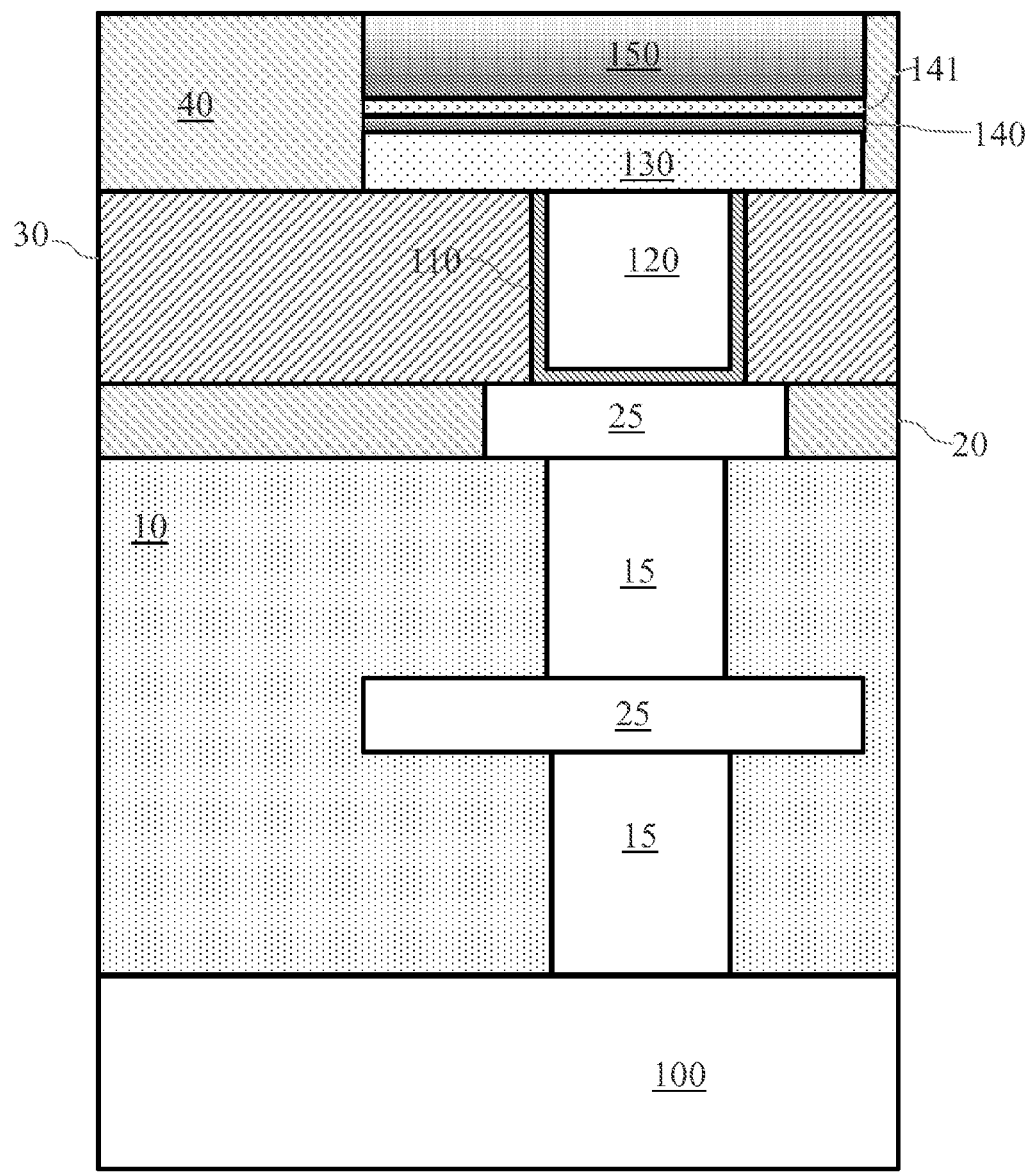

Referring next to FIG. 7F, a top electrode layer 150 is formed over the optional capping layer 141. In one or more embodiments, the top electrode layer 150 may be formed as a graded layer, for example, as described with respect to FIG. 3. However, in some embodiments, the top electrode layer 150 may be formed without any grading, for example, as described with respect to FIG. 1.

In various embodiments, the top electrode layer 150 is formed by the deposition of an electrochemically active metal such as copper, silver, zinc and others. During the deposition of the top electrode layer 150, the process conditions in the deposition chamber may be varied so as to vary the amount of metalloid being incorporated within the depositing top electrode layer 150. For example, the amount of metalloid may be varied based on a predetermined process in one embodiment. Alternatively, in another embodiment, the process conditions in the deposition chamber may be changed dynamically based on in-line monitoring of the deposition chamber and/or the depositing material.

Figure 8A:
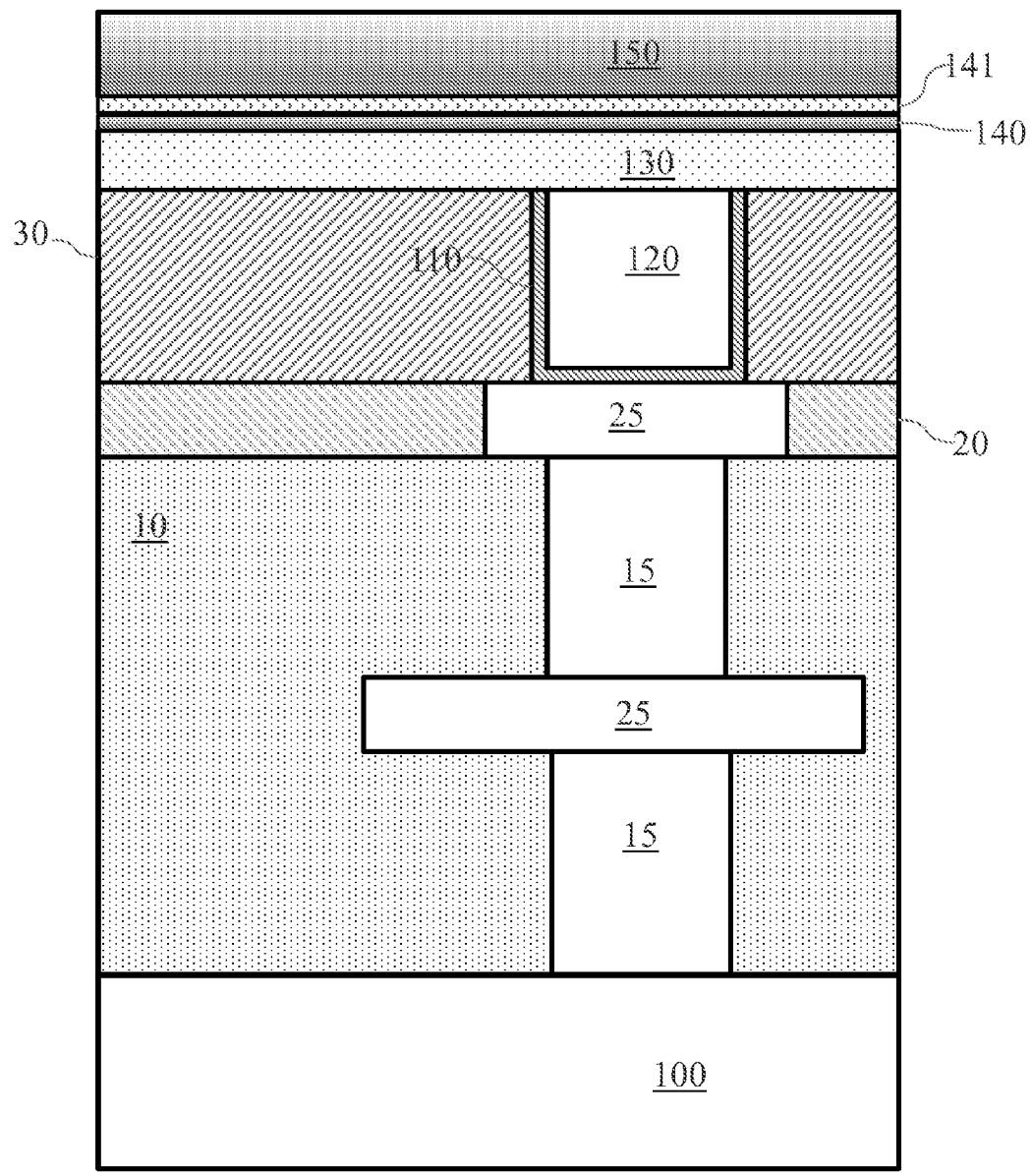
FIGS. 8A and 8B, illustrates cross-sectional views of a resistive switching device during various stages of fabrication in accordance with alternative embodiments of the invention.
Figure 8B:
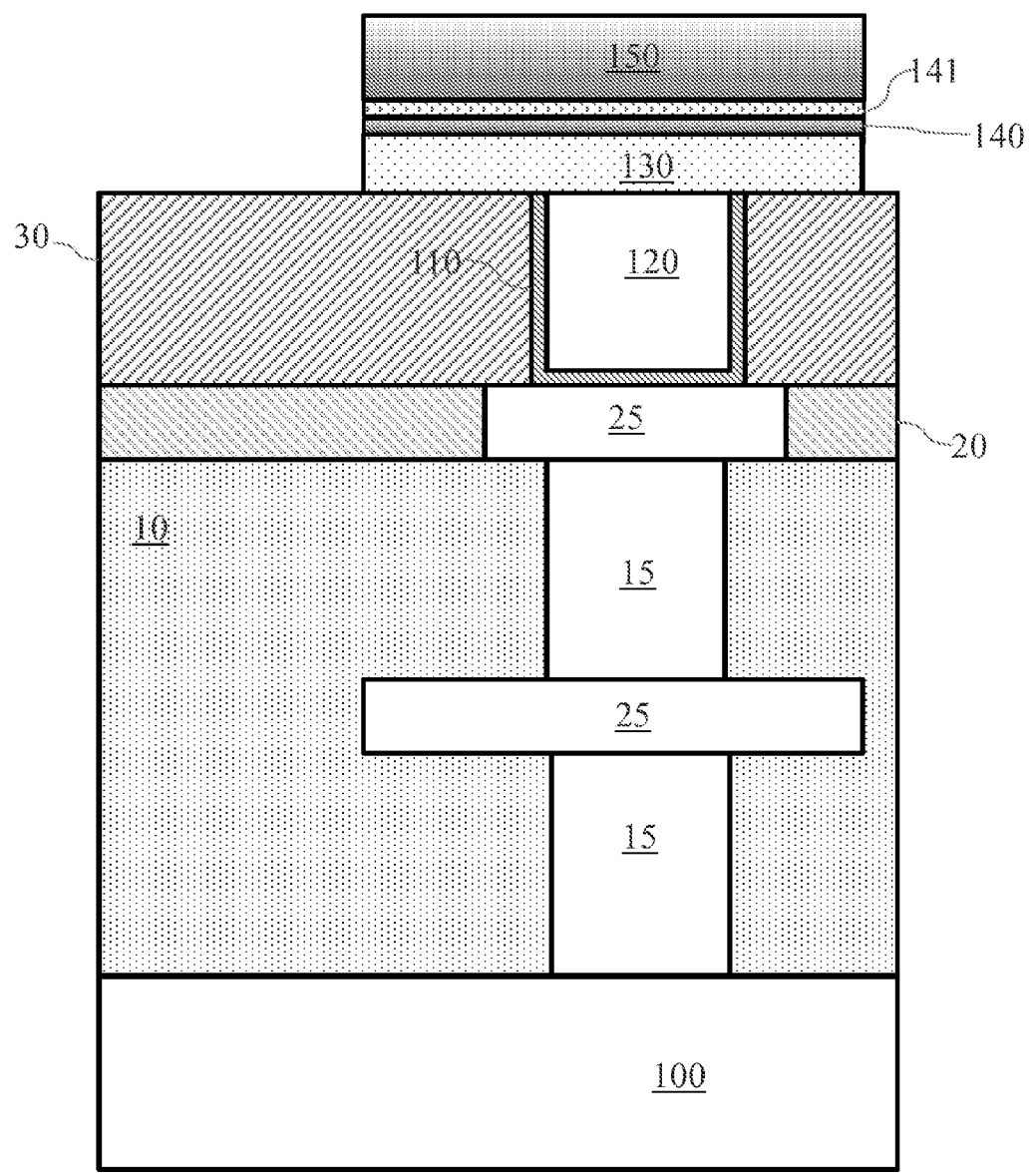

FIG. 8, which includes FIGS. 8A and 8B, illustrates cross-sectional views of a resistive switching device during various stages of fabrication in accordance with alternative embodiments of the invention.

This embodiment may proceed as described in prior embodiments with respect to FIGS. 7A-7B. Instead of forming patterned layers separately as in the prior embodiment, in this embodiment, the switching layer 130, the buffer layer 140, the capping layer 141, and the top electrode layer 150 may be deposited sequentially and patterned using a substractive etch process.

As illustrated in FIG. 8A, the switching layer 130, the buffer layer 140, the capping layer 141, and the top electrode layer 150 may be formed as blanket layers (unpatterned) as described in prior embodiments.

Referring to FIG. 8B, the switching layer 130, the buffer layer 140, the capping layer 141, and the top electrode layer 150 are patterned. In one embodiment, the switching layer 130, the buffer layer 140, the capping layer 141, and the top electrode layer 150 may be patterned using a single etch process. Alternatively, in other embodiments, the etch process and/or chemistry may be changed for one or more layers.

The fourth insulating layer 40 may be deposited over the patterned switching layer 130, buffer layer 140, capping layer 141, and top electrode layer 150 to form a structure as illustrated in FIG. 7F.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described using FIGS. 1-6 may be combined together in different combinations in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A resistive switching device comprising:
   a bottom electrode;
   a switching layer disposed over the bottom electrode;
   a buffer layer disposed over the switching layer, the buffer layer providing a buffer of ions of a memory metal, the buffer layer comprising an alloy of the memory metal with an alloying element comprising antimony, tin, bismuth, aluminum, germanium, silicon, or arsenic, wherein the buffer layer comprises a thickness of about 1 nm to about 50 nm; and
   a top electrode disposed over the buffer layer, the top electrode providing a source of the memory metal.

2. The device of claim 1, further comprising a cap layer disposed between the buffer layer and the top electrode, the cap layer forming a barrier to a reactive element in the buffer layer.

3. The device of claim 1, wherein the top electrode comprises a second alloying element comprising antimony, tin, bismuth, aluminum, arsenic, germanium, and silicon.

4. The device of claim 3, wherein the alloying element and the second alloying element are the same element.

5. The device of claim 1, wherein the top electrode comprises a graded profile of a second alloying element.

6. The device of claim 5, wherein the alloying element and the second alloying element are the same element.

7. The device of claim 1, wherein the buffer layer comprises a graded profile of the alloying element.

8. The device of claim 1, wherein the buffer layer comprises a second alloying element, the second alloying element comprising tellurium or sulfur, wherein the second alloying element has a graded profile, and wherein the second alloying element has a peak concentration at an interface between the switching layer and the buffer layer.

9. The device of claim 8, wherein the second alloying element has a minimum concentration at an interface between the top electrode and the buffer layer.

10. A resistive switching device comprising:
a bottom electrode;
a switching layer disposed over the bottom electrode;
a buffer layer disposed over the switching layer, the buffer layer providing a buffer of ions of a memory metal, the buffer layer comprising a reactive element;
a cap layer disposed over the buffer layer, the cap layer forming a barrier to the reactive element in the buffer layer; and
a top electrode disposed over the buffer layer, the top electrode providing a source of the memory metal.

11. The device of claim 10, wherein the buffer layer comprises an alloy of the memory metal with an alloying element comprising antimony, tin, bismuth, aluminum, arsenic, germanium, and silicon.

12. The device of claim 10, wherein the reactive element comprises tellurium or sulfur.

13. The device of claim 10, wherein the cap layer comprises a thickness of less than 10 nm.

14. The device of claim 10, wherein the cap layer comprises a thickness of about 0.5 nm to about 10 nm.

15. The device of claim 10, wherein the cap layer comprises a layer of antimony, germanium, or tin.

16. The device of claim 10, wherein the cap layer comprises a metal alloy comprising an alloying element and an element of the top electrode.

17. A method of forming a resistive switching device, the method comprising:
forming a bottom electrode in a first insulating layer;
forming a second insulating layer over the first insulating layer;
forming a switching layer over the bottom electrode in the second insulating layer;
forming a buffer layer over the switching layer in the second insulating layer, the buffer layer providing a buffer of ions of a memory metal, the buffer layer comprising an alloy of the memory metal with an alloying element comprising antimony, tin, bismuth, aluminum, germanium, silicon, or arsenic, wherein forming the buffer layer comprises forming a layer having a thickness of about 1 nm to about 50 nm; and
forming a top electrode over the buffer layer in a third insulating layer, the top electrode providing a source of the memory metal.

18. The method of claim 17, wherein the second insulating layer and the third insulating layer are formed in a common process step.

19. The method of claim 17, further comprising forming a cap layer between the buffer layer and the top electrode, the cap layer forming a barrier to a reactive element in the buffer layer.

20. The method of claim 17, wherein forming the top electrode comprises forming an alloy comprising a second alloying element comprising antimony, tin, bismuth, aluminum, arsenic, germanium, and silicon.

21. The method of claim 20, wherein the alloying element and the second alloying element are the same element.

22. The method of claim 17, wherein forming the top electrode comprises a graded profile of a second alloying element.

23. The method of claim 22, wherein the alloying element and the second alloying element are the same element.

24. The method of claim 17, wherein forming the buffer layer comprises forming a graded profile of the alloying element.

25. The method of claim 17, wherein forming the buffer layer comprises forming an alloy comprising a second alloying element, the second alloying element comprising tellurium or sulfur, wherein the second alloying element has a graded profile, and wherein the second alloying element has a peak concentration at an interface between the switching layer and the buffer layer.

26. The method of claim 25, wherein the second alloying element has a minimum concentration at an interface between the top electrode and the buffer layer.

27. A resistive switching device comprising:
a bottom electrode;
a switching layer disposed over the bottom electrode;
a buffer layer disposed over the switching layer, the buffer layer providing a buffer of ions of a memory metal; and
a top electrode disposed over the buffer layer, the top electrode providing a source of the memory metal, the top electrode comprising an alloying element comprising antimony, tin, bismuth, aluminum, arsenic, germanium, and silicon.

28. The device of claim 27, wherein the alloying element has a graded profile within the top electrode.

29. The device of claim 28, wherein a concentration of the alloying element has a peak concentration at about an interface of the top electrode with the buffer layer.

30. The device of claim 28, wherein the graded profile extends over at least 10 nm.

31. The device of claim 28, wherein the graded profile has a thickness of about 1 nm to about 10 nm.

32. The device of claim 28, wherein the alloying element changes in concentration within the graded profile by at least 100 times within about 0.5 to about 0.1 of a thickness of the top electrode from an interface of the top electrode with the buffer layer.

33. A resistive switching device comprising:
a bottom electrode;
a switching layer disposed over the bottom electrode;
a buffer layer disposed over the switching layer, the buffer layer providing a buffer of ions of a memory metal; and
a top electrode disposed over the buffer layer, the top electrode providing a source of the memory metal and comprising an alloying element, wherein the alloying element has a graded profile within the top electrode.

34. The device of claim 33, wherein the buffer layer comprises a graded profile of the alloying element.

35. The device of claim 33, wherein the buffer layer comprises a second alloying element, the second alloying element comprising tellurium or sulfur, wherein the second alloying element has a graded profile, and wherein the second alloying element has a peak concentration at an interface between the switching layer and the buffer layer.

36. A resistive switching device comprising:
a bottom electrode;
a switching layer disposed over the bottom electrode;
a buffer layer disposed over the switching layer, the buffer layer providing a buffer of ions of a memory metal, the buffer layer comprising an alloy of the memory metal with an alloying element comprising antimony, tin, bismuth, aluminum, germanium, silicon, or arsenic; and
a top electrode disposed over the buffer layer, the top electrode providing a source of the memory metal, wherein the top electrode comprises a second alloying element comprising antimony, tin, bismuth, aluminum, arsenic, germanium, and silicon.

* * * * *